(12) United States Patent
Ishii

(10) Patent No.: US 6,985,522 B2
(45) Date of Patent: Jan. 10, 2006

(54) VARIABLE-GAIN DIGITAL FILTER

(75) Inventor: Tatsuya Ishii, Tokyo (JP)

(73) Assignee: NEC Corporation, Tokyo (JP)

( * ) Notice: Subject to any disclaimer, the term of this patent is extended or adjusted under 35 U.S.C. 154(b) by 661 days.

(21) Appl. No.: 09/741,194

(22) Filed: Dec. 21, 2000

(65) Prior Publication Data

US 2001/0005396 A1 Jun. 28, 2001

(30) Foreign Application Priority Data

Dec. 28, 1999 (JP) .................................. 11-372497

(51) Int. Cl.
*H04H 7/30* (2006.01)
*H03K 5/159* (2006.01)

(52) U.S. Cl. ..................... 375/229; 375/232; 708/300; 708/322

(58) Field of Classification Search ............... 333/28 R, 333/18; 708/323, 322, 319, 316, 300; 375/350, 375/232, 230, 229
See application file for complete search history.

(56) References Cited

U.S. PATENT DOCUMENTS

| | | |
|---|---|---|
| 3,955,193 A | 5/1976 | Koffler et al. |
| 5,270,481 A | 12/1993 | Matsunaga et al. |
| 5,541,866 A | 7/1996 | Sato et al. |
| 5,642,382 A | 6/1997 | Juan |
| 5,935,199 A * | 8/1999 | Del Signore ................ 708/313 |
| 5,970,091 A * | 10/1999 | Nishida et al. ............. 375/232 |
| 6,360,240 B1 | 3/2002 | Takano et al. |
| 6,606,641 B1 * | 8/2003 | Wittig et al. ................ 708/319 |

FOREIGN PATENT DOCUMENTS

| | | |
|---|---|---|
| EP | 0813301 A1 | 6/1996 |
| JP | 63 257319 A | 10/1988 |
| JP | 2-19014 A | 1/1990 |
| JP | 3-124110 | 5/1991 |
| JP | 5-152897 A | 6/1993 |
| JP | 06-140876 | 5/1994 |
| JP | 6-245300 A | 9/1994 |
| JP | 8-162906 A | 6/1996 |
| JP | 11-220357 A | 8/1999 |
| WO | WO 97/50173 A | 6/1997 |
| WO | WO 99/54996 | 10/1999 |

OTHER PUBLICATIONS

U. Tietze, C. Schenk: "Halbleiter-Schaltungstechnik" 1990, Springer Verlag, Berlin, XP002289754 9. Auflage *p. 253, paragraph 4* .

* cited by examiner

Primary Examiner—Betsy L. Deppe
(74) Attorney, Agent, or Firm—Foley & Lardner LLP

(57) ABSTRACT

A variable-gain digital filter includes a selector and multiplier arranged inside the digital filter for regulating gain whereby the number of bits of filter input is X, the number of flip-flops inside the filter is X×n bits, and a (Y×n bit) reduction in the number of flip-flops is enabled. The gain regulation circuit incorporated within the digital filter enables a reduction in circuit scale.

10 Claims, 7 Drawing Sheets

VARIABLE-GAIN DIGITAL FILTER

BACKGROUND OF THE INVENTION

1. Field of the Invention

The present invention relates to a digital filter, and particularly to a variable-gain digital filter, which is a crucial technology used for such purposes as restricting bandwidth in the field of digital communication widely employed in mobile communication.

2. Description of the Related Art

In a system in which a number of types of gain are present in the same time slot such as in an IS-95 (Interim Standard 95, a digital portable telephone system mode standard in the U.S.) system, gain regulation (switching) is conventionally carried out in a section preceding the bandwidth restricting (digital) filter. If this restricting is carried out in a succeeding section, discontinuity points occur in the output and the bandwidth restricting characteristic of the filter will no longer be satisfied.

Thus, as shown in FIG. 1, gain selector 51 and multiplier 52 are arranged to precede digital filter 53, and gain that is selected in gain selector 51 for data that have undergone baseband processing is multiplied and the result then applied to digital filter 53. If X bits is the data that have undergone baseband processing and Y bits is the number of bits of gain in this case, the input to digital filter 53 is X+Y bits if computation is carried out without any loss of accuracy, and the construction of digital filter 53 is a circuit such as shown in FIG. 2.

Digital filter 53 shown in FIG. 2 is provided with a selector that switches input data and a coefficient sequence n times (where n is the filter order) in one time slot. Digital filter 53 is a circuit that realizes FIR (Finite Impulse Response) filtering by time division processing. The operation is equivalent to the circuit shown in FIG. 4 that lacks multiplier 16 and selector 15. As shown in the timing chart of FIG. 3, input data IN(N)-IN(N-1) undergo time division multiplexing in selector SEL13, and after being multiplied with time division multiplexed coefficients k1–kn by selector SEL14, the result is integrated. Although the time division process enables the elimination of the multiplier and adder, a number (X+Y)×n bits of flip-flops are required because the number of input bits is X+Y, and this large number of components raises the problem of circuit scale.

In an IS-95 system that employs CDMA (Code Division Multiple Access), symbols having different gain must be transmitted within one frame. If gain is regulated in a section following the bandwidth restricting filter in such a case, discontinuity points will occur in the output and the filter will fail to satisfy the filter bandwidth restriction characteristic as described hereinabove. Gain must therefore be regulated in a section preceding the filter.

As described hereinabove using the prior art example of FIG. 1, selector 51 and multiplier 52 for regulating gain are provided in a section before the filter in the prior art, and if X is the number of bits of data input and Y is the number of bits of gain, the number of bits of input of digital filter 53 will be X+Y bits. Accordingly, a number (X+Y)×n bits of FF (flip-flops) are required in digital filter 53 in the case of the prior-art example.

SUMMARY OF THE INVENTION

The present invention was realized in view of the above-described state of the prior art, is directed toward solving the above-described problems of the prior art, and has as an object the provision of a novel variable-gain digital filter that is capable of reducing the scale of a circuit by incorporating a gain regulation circuit, which was arranged before the filter in the prior art, within the filter.

According to the variable-gain digital filter for realizing the above-described object according to the present invention, in a variable-gain digital filter that includes a gain regulation circuit in a section preceding the digital filter, the gain regulation circuit being composed of a first selector for selecting gain and a first multiplier for multiplying the output of the first selector with input data, the gain regulation circuit is removed from the section preceding the filter and incorporated inside the filter.

The first multiplier of the gain regulation circuit multiplies gain signals that are outputted from the first selector with a coefficient sequence that is switched and outputted from a second selector for each fixed time interval and outputs the result; a second multiplier that multiplies the output of the first multiplier with input data that are selected by a third selector that selects and outputs from each output of a shift register; and the output of the second multiplier is integrated and outputted by an integrator.

The variable-gain digital filter according to the present invention is constituted by: a shift register that is composed of n (n being a positive integer) stages of flip-flops and that both shifts input data and generates delay output by each stage; a first selector for selecting gain; a second selector for selecting a coefficient sequence; a third selector for selecting each delay output of the shift register; a first multiplier for multiplying output of the first selector with output of the second selector; a second multiplier for multiplying output of the first multiplier with output of the third selector; and an integrator for integrating output of the second multiplier.

Alternatively, the variable-gain digital filter according to the present invention is constituted by dividing the first, second, and third selectors and the first and second multipliers into two such that two each of the first to third selectors and the first and second multipliers are used, each of the first to third selectors switching output for time interval of (T/n)×2 (where T is the duration of one time slot, and n is the filter order).

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Details of the first embodiment of the variable-gain digital filter according to the present invention are next described with reference to the accompanying figures.

The present invention is described hereinbelow for a case in which the invention is used in the downstream transmission section of an IS-95 system.

Figure 4:
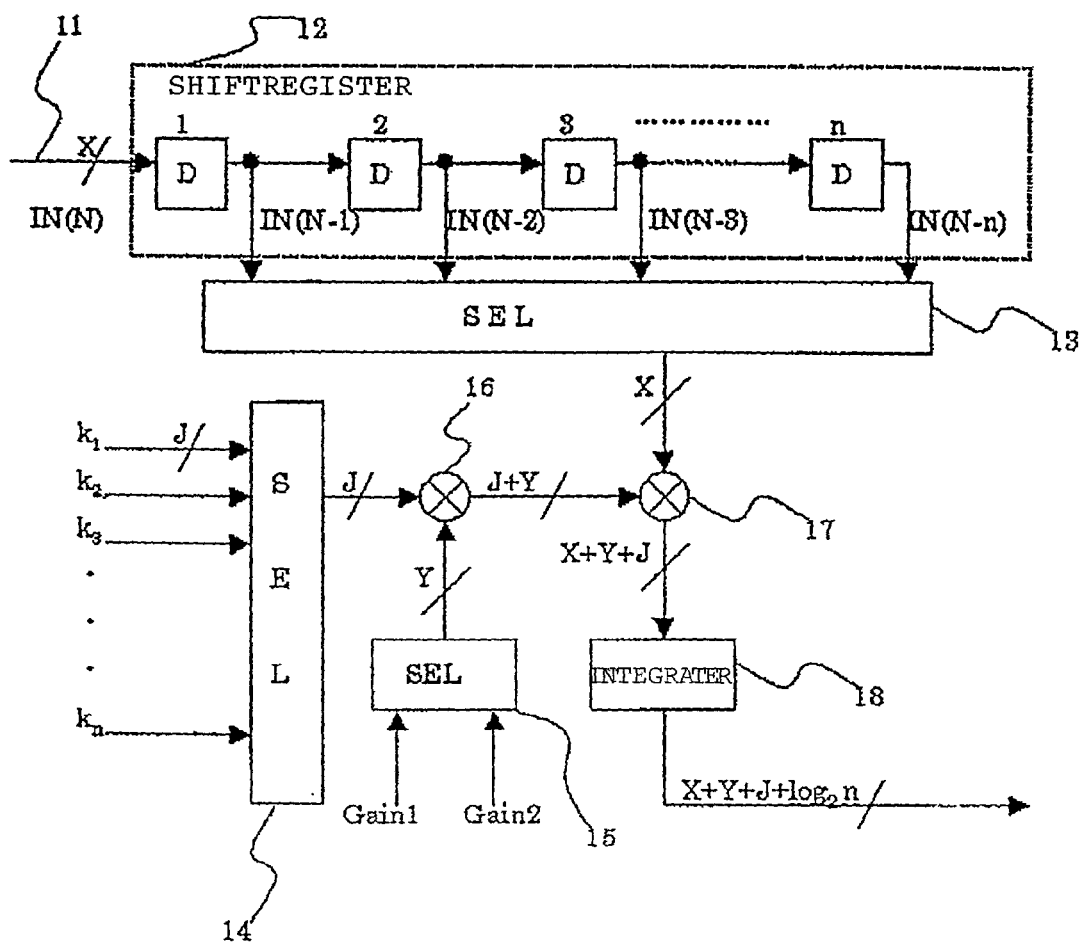
FIG. 4 is a block diagram showing the first embodiment of a digital filter according to the present invention.

FIG. 4 is a block diagram showing the first embodiment according to the present invention.

Figure 5:
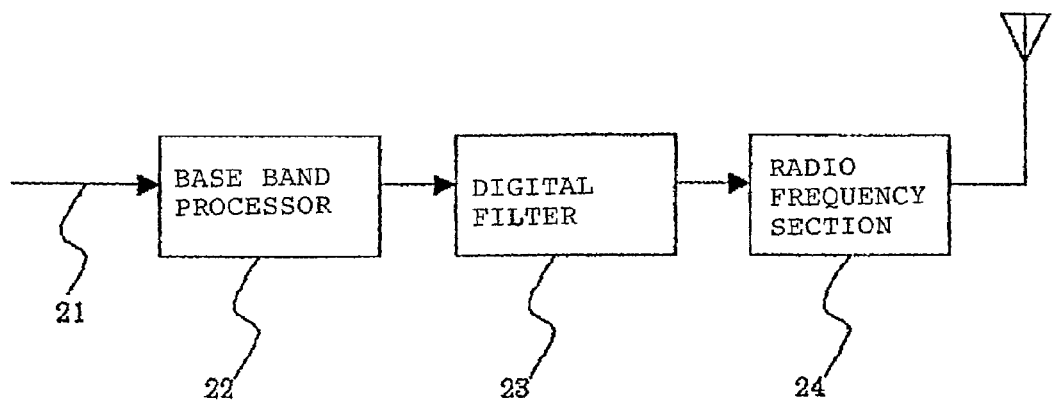
FIG. 5 is a block diagram showing the downstream transmission system of the IS-95 system in which the present invention is applied.

FIG. 5 shows the block configuration of the downstream transmission system of an IS-95 system.

After undergoing processing in baseband processor 22 such as attachment of CRC [cyclic redundancy check], convolutional encoding, block interleaving, long-code dispersion; power control bit insertion, Walsh dispersion, and short-code dispersion, transmission data 21 are applied to digital filter 23 for restricting the bandwidth. The output of digital filter 23 are converted to a radio frequency in RF unit 24 and then transmitted to the outside by an antenna.

FIG. 4 shows the details of digital filter 23, which is the inventive portion of the present invention. The digital filter of FIG. 4 is realized by time-division processing of a FIR filter of the order n.

Referring now to FIG. 4, input data 11 (X bits) are applied to shift register 12 having n stages. In addition, coefficient sequence k1–kn (J bits) is switched for each fixed time interval by selector 14 and multiplied by multiplier 16 with a gain signal (Y bits) that is selected by selector 15. The multiplied signal (J+Y bits) is multiplied in multiplier 17 with the output (X bits) of shift register 12 that is switched every fixed time interval by selector 13, and the result is applied to integrator 18. In integrator 18, data are integrated for each fixed time interval and outputted (X+Y+J+Log2 n bits).

A simplified description of the present embodiment was presented in the foregoing explanation, and a more detailed explanation of the constitution and operation of the embodiment follows hereinbelow.

In FIG. 5, a transmission signal that has undergone processing in baseband processor 22 is applied to digital filter 23 as data of X bits. In digital filter 23, the X bits of input data are applied to shift register 12 of n stages as shown in FIG. 4.

Here, if IN(N) is the input data and IN(N-1) is input data that have been delayed one time slot, the output data of shift register 12 will be IN(N), IN(N-1), IN(N-2), . . . IN(N-n). Selector 13 switches and outputs IN(N), IN(N-1), IN(N-2), . . . IN(N-n) for each time interval T/n, which is the time interval T of one time slot divided by n.

Selector 14 similarly switches and outputs the coefficient sequence k1, k2, . . . kn for each time interval T/n.

A normal FIR filter of the prior art is not provided with selector SEL15 or multiplier 16, and the products k1·IN(N-1), k2·IN(N-2), . . . kn·IN(N-n) are computed for each time interval T/n by multiplier 17, and the value shown by equation (1) is outputted for each time interval T by integrator 18, which is reset for each time interval T (one time slot).

$$k1 \cdot IN(N-1) + k2 \cdot IN(N-2) + \ldots + kn \cdot IN(N-n) = \Diamond kn \cdot IN(N-1) \quad (1)$$

Figure 3:
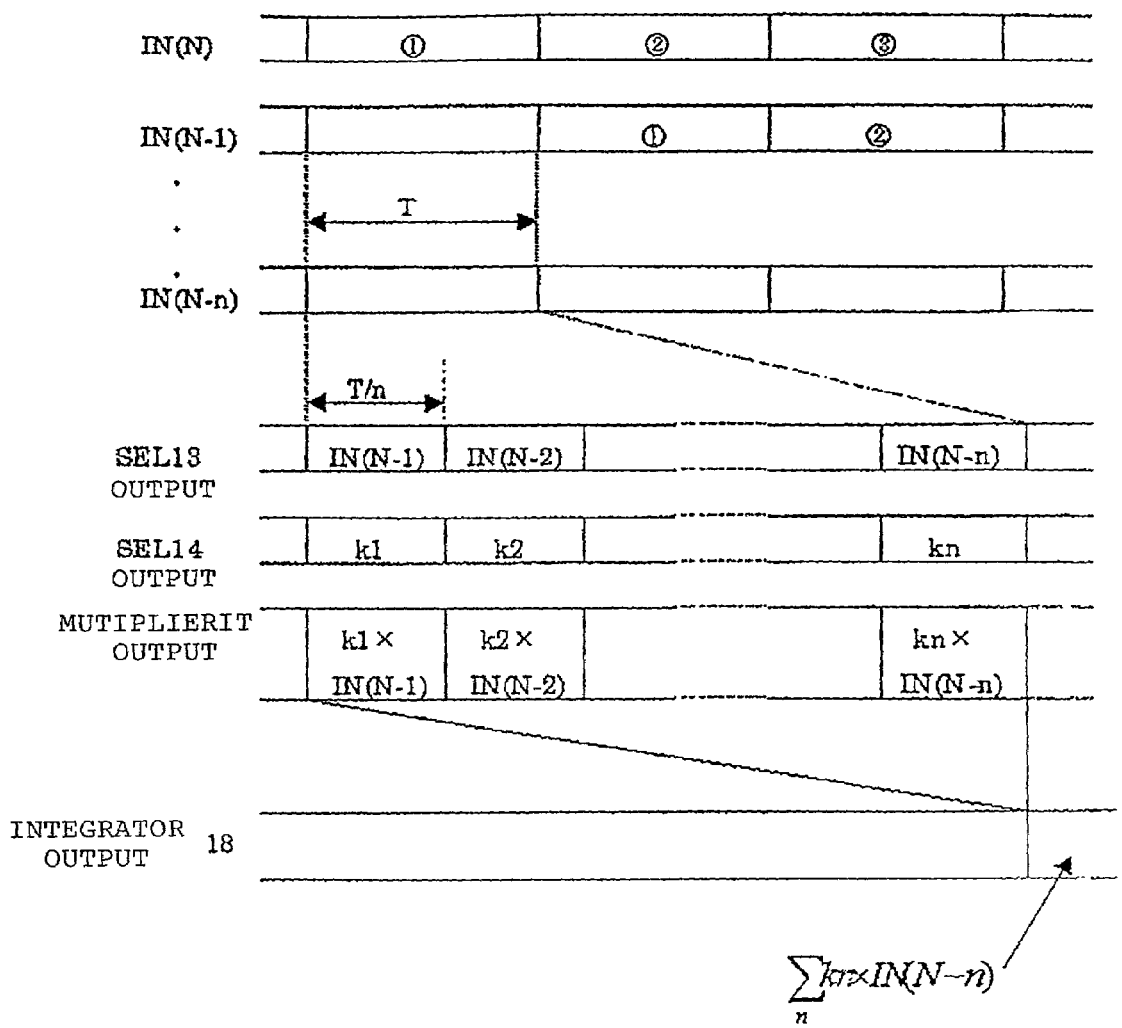
FIG. 3 is a timing chart of the operation of the prior-art example shown in FIG. 2.

The timing chart for this case is shown in FIG. 3.

Next, regarding the case of the present invention in which the selector SEL15 and multiplier 16 are used, a power control bit portion is present in the transmission data in the downstream (from base station to terminal) traffic channel of an IS-95 system, and the transmission power (gain) of this portion and other portion must be changed.

Gain1 is the gain for power control bits and Gain2 is the gain for other portions, and selector SEL15 performs switching of them. The selected gain is multiplied with coefficient sequence kn at multiplier 16, and the result is then multiplied with IN(N), IN(N-1), IN(N-2), . . . IN(N-n) at multiplier 17.

In more concrete terms, if IN(N-1), IN(N-2), IN(N-3) are the power control bits in a particular time slot and the other bits (IN(N-4), IN(N-5), . . . , IN(N-n)) are not the power control bits, the output of selector 15 is controlled so as to be Gain1 at only the times when the output of selector 14 is k1, k2, and k3 and to be Gain2 at all other times. The output of integrator 18 that corresponds to that time slot is therefore as shown in equation 2:

$$\text{Gain1} \cdot (k1 \cdot IN(N-1) + k2 \cdot IN(N-2) + k3 \cdot IN(N-3) + k3 \cdot IN(N-3)) + \text{Gain2} \cdot (k4 \cdot IN(N-4) + \ldots + kn \cdot IN(N-n)) \quad (2)$$

Figure 6:
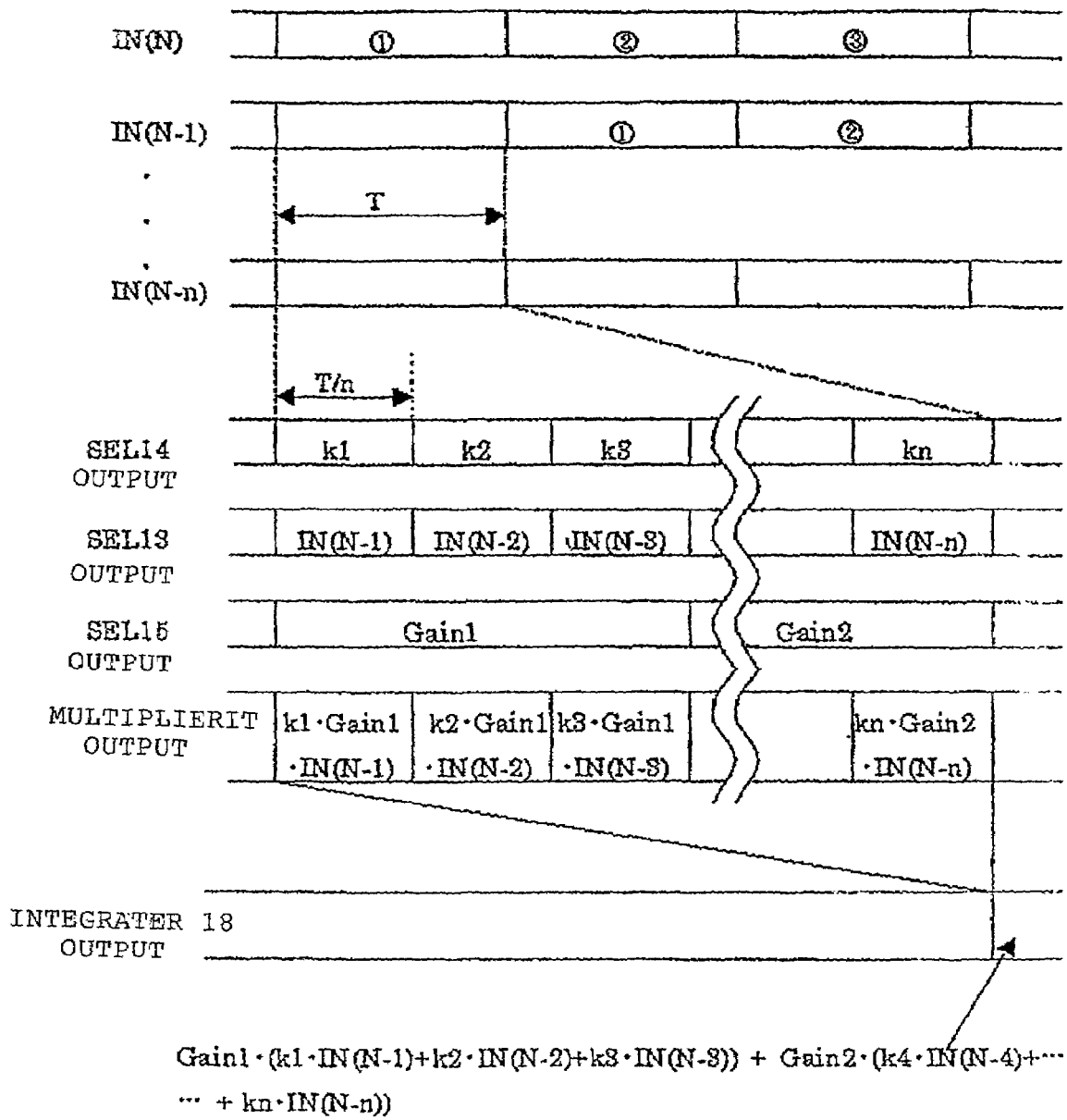
FIG. 6 is a timing chart of the operation of the first embodiment shown in FIG. 4.

FIG. 6 shows the timing chart for this case.

If the data of IN(N) are then power control bits in the next time slot, IN(N-1), IN(N-2), IN(N-3), and IN(N-4) become power control bits, the output of selector 15 is Gain1 when the output of selector 14 is k1, k2, k3, and k4 and Gain2 at all other times, and the output of integrator 18 that corresponds to this time slot is therefore as shown in equation 3:

$$\text{Gain1} \cdot (k1 \cdot IN(N-1) + k2 \cdot IN(N-2) + k3 \cdot IN(N-3) + k4 \cdot IN(N-4)) + \text{Gain2} \cdot (k5 \cdot IN(N-5) + \ldots + kn \cdot IN(N-n)) \quad (3)$$

If the data of IN(N) are not currently the power control bits, IN(N-2), IN(N-3), IN(N-4) become the power control bits, the output of selector 15 becomes Gain1 when the output of selector 14 is k2, k3, and k4 and becomes Gain2 at all other times, and the output of integrator 18 that corresponds to this time slot is as shown in equation (4):

$$\text{Gain1} \cdot (k2 \cdot IN(N-2) + k3 \cdot IN(N-3) + k4 \cdot IN(N-4)) + \text{Gain2} \cdot (k1 \cdot IN(N-1) + k5 \cdot IN(N-5) + \ldots + kn \cdot IN(N-n)) \quad (4)$$

Thus, data for which gain has been regulated and bandwidth restricted in digital filter 23 are converted to a radio frequency in RF unit 24 and transmitted by an antenna.

We refer to FIG. 7, in which is shown a block configuration of the second embodiment according to the present invention, and the second embodiment according to the present invention is next described with reference to the figure.

Figure 7:
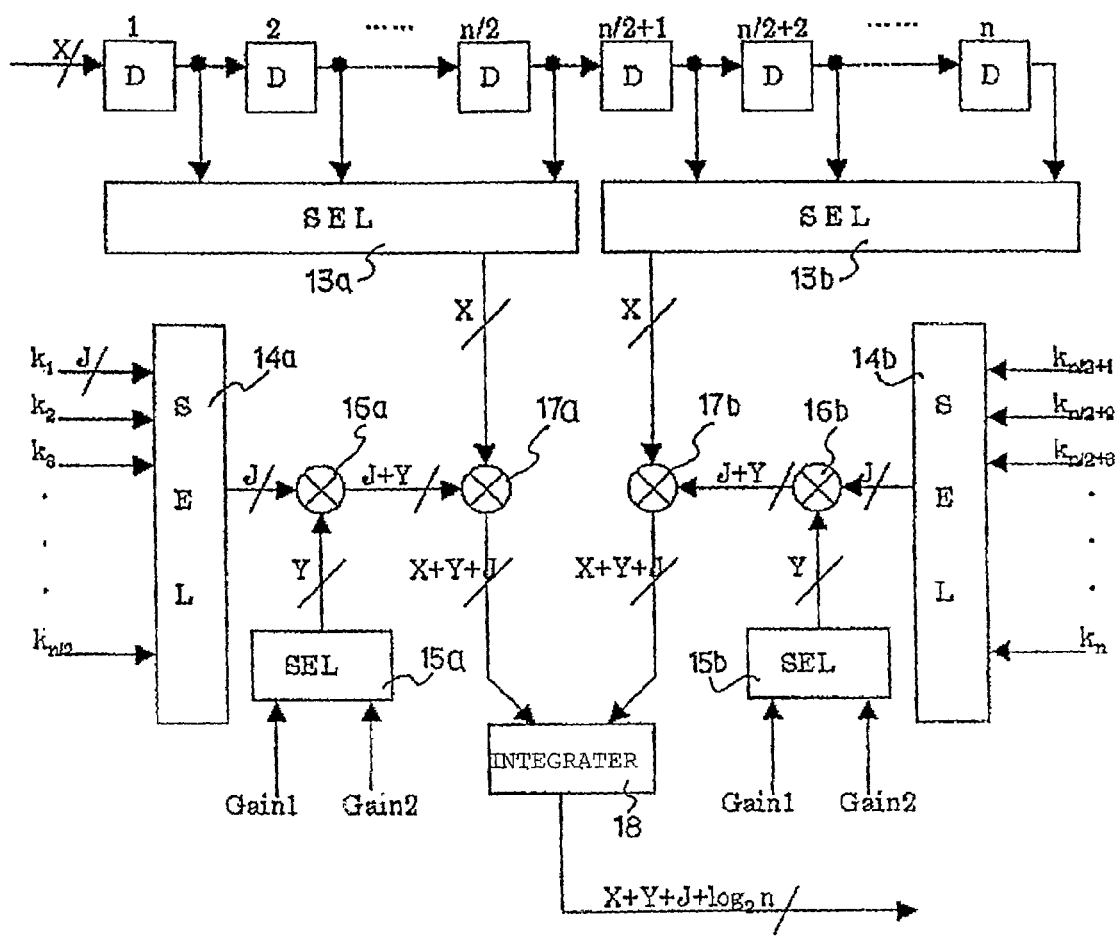
FIG. 7 is a block diagram of the second embodiment of the present invention.

FIG. 7 shows a case in which two circuits are employed for each of selectors SEL13, 14, and 15 and multipliers 16 and 17 in FIG. 4 wherein each of the selectors switches output for each time interval (T/n)×2 (where T is the duration of one time slot and n is the filter order).

In other words, each of the elements of FIG. 4 is constituted by two elements, selector 13 of FIG. 4 being constituted by selectors 13a and 13b, selector 14 by selectors 14a and 14b, selector 15 by selectors 15a and 15b, multiplier 16 by multipliers 16a and 16b, and multiplier 17 by multipliers 17a and 17b.

The output timing of the integrator is unchanged from that of FIG. 4, but the multiplication performed to arrive at this result takes twice as much time and is performed by twice as many circuits.

Although the scale of the circuit in the embodiment shown in FIG. 7 is obviously greater than the configuration of FIG. 4, the embodiment is effective when n is high and the operating speed is not sufficient. The embodiment is also effective to improve the processing speed of the digital filter.

Similarly, an embodiment can be considered as yet another embodiment in which a multiplier operating speed of 1/m is realized with in times the circuit scale, and also effective for improve the processing speed of the digital filter.

The present invention is constructed and operates as described hereinabove and has as its effect the reduction of circuit scale.

Figure 1:
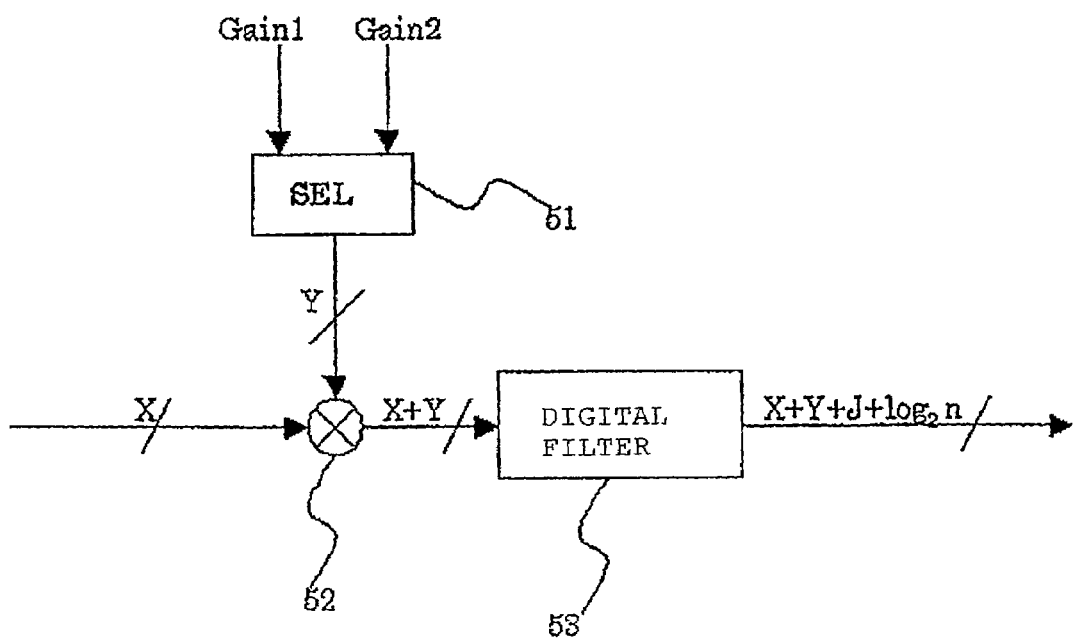
FIG. 1 is a block diagram showing the portion preceding a digital filter IS-95 of the prior art.
Figure 2:
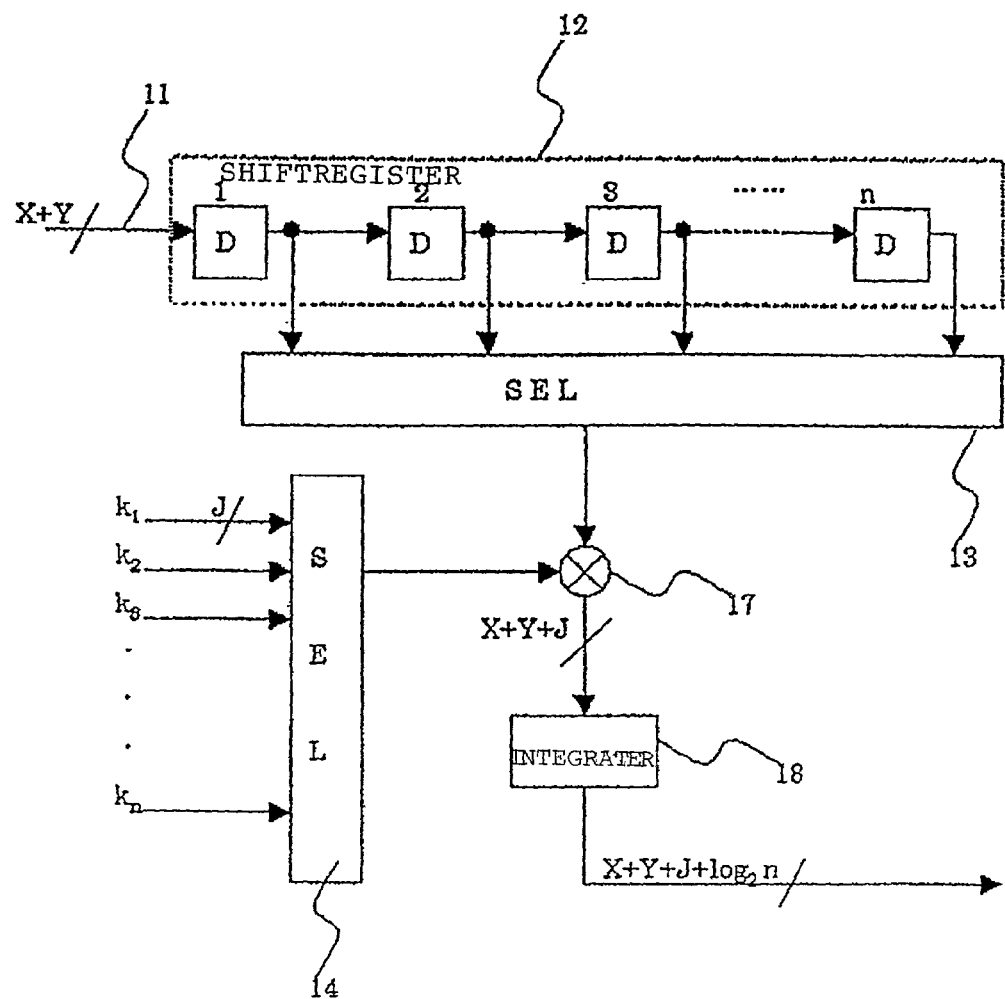
FIG. 2 is a block diagram showing the configuration of a digital filter of the prior art.

In other words, in this invention, circuit scale is reduced by incorporating gain selector 51 and multiplier 52 in the prior-art example of FIG. 1 into the digital filter (15 and 16 in FIG. FIG. 4). Specifically, in a case in which X is the number of data bits after baseband processing, Y is the number of gain bits, J is the number of bits of the filter coefficient sequence, and n is the order of the filter, the necessary circuit scale in the prior-art method (FIG. 1 and FIG. 2) and in the method of this invention (the present invention) (FIG. 4) are as shown in Table 1:

TABLE 1

| | FF (flip-flops) | Multiplier | Integrator |
|---|---|---|---|
| Prior-art Method | X+Y bits: n units | X bits × Y bits: 1 unit<br>X+Y bits × J bits: 1 unit | X+Y+J bit input<br>X+Y+J+log2n bit output |
| Method of Present Invention | X bits: n units | J bits × Y bits: 1 unit<br>J+Y bits × X bits: 1 unit | X+Y+J bit input<br>X+Y+J+log2n bit output |

A comparison of the circuit scale shows that the methods are equivalent regarding the integrator, but regarding the multipliers, if X+Y bits×J bits and J+Y bits×X bits are considered equivalent, the method of the present invention has smaller circuit scale when X>J, and the prior art method has smaller circuit scale when J>X.

In either case, however, the method of the present invention has (Y×n bits) fewer flip-flops. Accordingly, the present invention affords a large reduction in circuit scale, except in a special case when J>>X in which the degree of improvement of flip-flops FF surpasses the degree of deterioration of multipliers.

The degree of improvement of flip-flops is high and the effect of the invention is particularly great in cases in which the number of bits of gain Y or the order n of the filter is high.

While preferred embodiments of the present invention have been described using specific terms, such description is for illustrative purposes only, and it is to be understood that changes and variations may be made without departing from the spirit or scope of the following claims.

What is claimed is:

1. A variable-gain digital filter operating on input data and providing delayed input data including power control bits as a portion of said delayed input data and non-power control bits as another portion of said delayed input data, said digital filter having a construction in which a gain regulation circuit is incorporated inside the digital filter, said gain regulation circuit receiving said delayed input data and comprising: a first selector for selecting a first gain signal corresponding to said power control bits and a second gain signal corresponding to the non-power control bits; and a first multiplier for directly multiplying some coefficient sequences with said first gain signal and other coefficient sequences with said second gain signal, said first and second gain signals output from said first selector.

2. A variable-gain digital filter according to claim 1 wherein:
said first multiplier of said gain regulation circuit multiplies the first and second gain signals that is outputted from said first selector with the coefficient sequences that are switched and outputted from a second selector for each fixed time interval;
an output of said first multiplier is multiplied at a second multiplier with selected delayed input data, said selected delayed input data selected by a third selector that selects ones of said delayed input data from plural outputs of a shift register; and
an output of said second multiplier is then integrated by an integrator and outputted.

3. A variable-gain digital filter comprising:
a shift register that is constituted by a plurality of stages of flip-flops wherein each stage shifts input data and generates delayed data, a plurality of said delayed data corresponding to power control bits and a remainder of said delayed data not corresponding to power control bits;
a first selector for selecting a first gain signal and a second gain signal;
a second selector for selecting a coefficient sequence;
a third selector for selecting each delayed data of said shift register;
a first multiplier for multiplying said first gain signal with some outputs of said second selector resulting in a first product sequence, and for multiplying said second gain signal with other outputs of said second selector resulting in a second product sequence;
a second multiplier for multiplying outputs of said first multiplier containing said first product sequence with outputs of said third selector containing said plurality of said delayed data corresponding to said power control bits, and for multiplying other outputs of said first multiplier containing said second product sequence with other outputs of said third selector containing the remainder of said delayed data not corresponding to said power control bits; and
an integrator for integrating an output of said second multiplier.

4. A variable-gain digital filter according to claim 3 wherein:
said first, second, and third selectors and said first and second multipliers are doubled in quantity to form two circuits, each circuit having one of two first selectors, one of two second selectors, one of two third selectors, one of two first multipliers and one of two second multipliers, each of said two circuits handling one half of the delayed data; and
each of said two first, second and third selectors effects a selection at each time interval of (T/n)×2, where T is the duration of one time slot and n is a filter order.

5. A variable-gain digital filter according to claim 3 wherein:
said first, second, and third selectors and said first and second multipliers are doubled in quantity to form two circuits, each circuit having one of two first selectors, one of two second selectors, one of two third selectors, one of two first multipliers and one of two second multipliers, each of said two circuits handling half of the delayed data; and
each of said two first, second and third selectors effects a selection at each time interval of T/n, where T is the duration of one time slot and n is a filter order.

6. A variable-gain digital filter according to claim 3 wherein:
said first, second, and third selectors and said first and second multipliers are increased in quantity m times to form m circuits, each circuit having one of m first selectors, one of m second selectors, one of m third selectors, one of m first multipliers and one of m second multipliers, each of said m circuits handling only n/m delayed data allowing the processing speed of each of said m first multipliers and m second multipliers to be 1/m where m is an integer greater than one and n is a filter order.

7. A variable-gain digital filter according to claim 3 wherein:
said first, second, and third selectors and said first and second multipliers are increased in quantity m times to form m circuits, each circuit having one of m first selectors, one of m second selectors, one of m third selectors, one of m first multipliers and one of m second multipliers, each of said m circuits handling only n/m delayed data to improve the processing speed of the variable-gain digital filter where m is an integer greater than one and n is a filter order.

8. A variable-gain digital filter comprising:
a shift register that is constituted by a plurality of stages of flip-flops wherein each stage shifts input data and generates delayed data;
a first selector for selecting a gain;
a second selector for selecting a coefficient sequence;
a third selector for selecting each delayed data of said shift register;
a first multiplier for multiplying an output of said first selector with an output of said second selector;
a second multiplier for multiplying an output of said first multiplier with an output of said third selector; and
an integrator for integrating an output of said second multiplier; and
wherein:
said first, second, and third selectors and said first and second multipliers are doubled in quantity to form two circuits, each circuit having one of two first selectors, one of two second selectors, one of two third selectors, one of two first multiplier and one of two second multipliers, each of said two circuits handling half of the delayed data; and
each of said two first, second and third selectors effects a selection at each time interval of T/n, where T is the duration of one time slot and n is a filter order.

9. A variable-gain digital filter comprising:
a shift register that is constituted by a plurality of stages of flip-flops wherein each stage shifts input data and generates delayed data;
a first selector for selecting a gain;
a second selector for selecting a coefficient sequence;
a third selector for selecting each delayed data of said shift register;
a first multiplier for multiplying an output of said first selector with an output of said second selector;
a second multiplier for multiplying an output of said first multiplier with an output of said third selector; and
an integrator for integrating an output of at least said second multiplier; and
wherein:
said first, second, and third selectors and said first and second multipliers are increased in quantity m times to form m circuits, each circuit having one of m first selectors, one of m second selectors, third selectors, one of m first multipliers and one of m second multipliers, each of said m circuits handling only n/m delayed data allowing the processing speed of each of said m first multipliers and m second multipliers to be 1/m where m is an integer greater than one and n is a filter order, said integrator integrating outputs of each of said m first multipliers and each of said second multipliers.

10. A variable-gain digital filter comprising:
a shift register that is constituted by a plurality of stages of flip-flops wherein each stage shifts input data and generates delayed data by each stage;
a first selector for selecting a gain;
a second selector for selecting a coefficient sequence;
a third selector for selecting each delayed data of said shift register;
a first multiplier for multiplying an output of said first selector with an output of said second selector;
a second multiplier for multiplying an output of said first multiplier with an output of said third selector; and
an integrator for integrating an output of at least said second multiplier; and
wherein:
said first, second, and third selectors and said first and second multipliers are increased in quantity m times to form m circuits, each circuit having one of m first selectors, one of m second selectors, one of m third selectors, one of m first multipliers and one of m second multipliers, each of said m circuits handling only n/m delayed data to improve the processing speed of the variable-gain digital filter where in is an integer greater than one and n is a filter order, said integrator integrating outputs of each of said m first multipliers and each of said second multipliers.

* * * * *